(12) United States Patent
Wan et al.

(10) Patent No.: US 11,450,756 B2
(45) Date of Patent: *Sep. 20, 2022

(54) MANUFACTURING METHOD OF SEMICONDUCTOR CHIP

(71) Applicant: MEDIATEK Inc., Hsinchu (TW)

(72) Inventors: Cheng-Tien Wan, Hsinchu (TW); Yao-Tsung Huang, Hsinchu (TW); Yun-San Huang, Hsinchu (TW); Ming-Cheng Lee, Zhubei (TW); Wei-Che Huang, Hsinchu County (TW)

(73) Assignee: MEDIATEK INC., Hsinchu (TW)

( * ) Notice: Subject to any disclaimer, the term of this patent is extended or adjusted under 35 U.S.C. 154(b) by 91 days.

This patent is subject to a terminal disclaimer.

(21) Appl. No.: 17/001,784

(22) Filed: Aug. 25, 2020

(65) Prior Publication Data

US 2020/0388700 A1 Dec. 10, 2020

Related U.S. Application Data

(62) Division of application No. 16/121,730, filed on Sep. 5, 2018, now Pat. No. 10,790,380.

(Continued)

(51) Int. Cl.
*H01L 21/8238* (2006.01)
*H01L 29/66* (2006.01)
(Continued)

(52) U.S. Cl.
CPC ........... *H01L 29/66795* (2013.01); *H01L 21/823431* (2013.01); *H01L 21/823821* (2013.01); *H01L 21/845* (2013.01); *H01L 27/0886* (2013.01); *H01L 27/1211* (2013.01); *H01L 29/41791* (2013.01); *H01L 29/66818* (2013.01); *H01L 29/785* (2013.01); *H01L 29/7851* (2013.01)

(58) Field of Classification Search
CPC ....... H01L 21/823821; H01L 29/66795; H01L 29/785

See application file for complete search history.

(56) References Cited

U.S. PATENT DOCUMENTS 6,413,802 B1 7/2002 Hu et al.
7,638,381 B2 12/2009 Cheng et al.
(Continued)

FOREIGN PATENT DOCUMENTS

CN 103325736 A 9/2013
CN 106409789 A 2/2017

OTHER PUBLICATIONS

Krauns, Christian, EP Search Report dated Jul. 17, 2019 in Germany, Application No. 18195984.2, pp. 1-9.
(Continued)

*Primary Examiner* — Mark V Prenty
(74) *Attorney, Agent, or Firm* — McClure, Qualey & Rodack, LLP

(57) ABSTRACT

A semiconductor chip includes a substrate and a transistor. The transistor is formed on the substrate and includes an insulation layer and a fin. The fin includes a base portion and a protrusion connected with the base portion, wherein the protrusion is projected with respect to an upper surface of the base portion and has a recess recessed with respect to the upper surface.

3 Claims, 13 Drawing Sheets

Related U.S. Application Data

(60) Provisional application No. 62/574,772, filed on Oct. 20, 2017.

(51) Int. Cl.
    *H01L 29/78*      (2006.01)
    *H01L 21/84*      (2006.01)
    *H01L 27/12*      (2006.01)
    *H01L 29/417*     (2006.01)
    *H01L 27/088*     (2006.01)
    *H01L 21/8234*    (2006.01)

(56) References Cited

U.S. PATENT DOCUMENTS

| | | |
|---|---|---|
| 8,617,937 B2 | 12/2013 | Cheng et al. |
| 8,716,156 B1 | 5/2014 | Pawlak et al. |
| 9,443,935 B2 | 9/2016 | Oh et al. |
| 9,923,065 B2 | 3/2018 | Xie et al. |
| 10,431,660 B2 | 10/2019 | Cheng et al. |
| 10,790,380 B2 * | 9/2020 | Wan ............... H01L 29/41791 |
| 2007/0069254 A1 | 3/2007 | Cho et al. |
| 2013/0244392 A1 | 9/2013 | Oh et al. |
| 2015/0200276 A1 | 7/2015 | Cheng et al. |
| 2016/0379982 A1 | 12/2016 | You et al. |
| 2017/0103985 A1 | 4/2017 | Kim et al. |
| 2019/0081153 A1 | 3/2019 | Ching et al. |

OTHER PUBLICATIONS

CN Office Action dated Apr. 22, 2022 in Chinese application No. 201811223173.4.

* cited by examiner

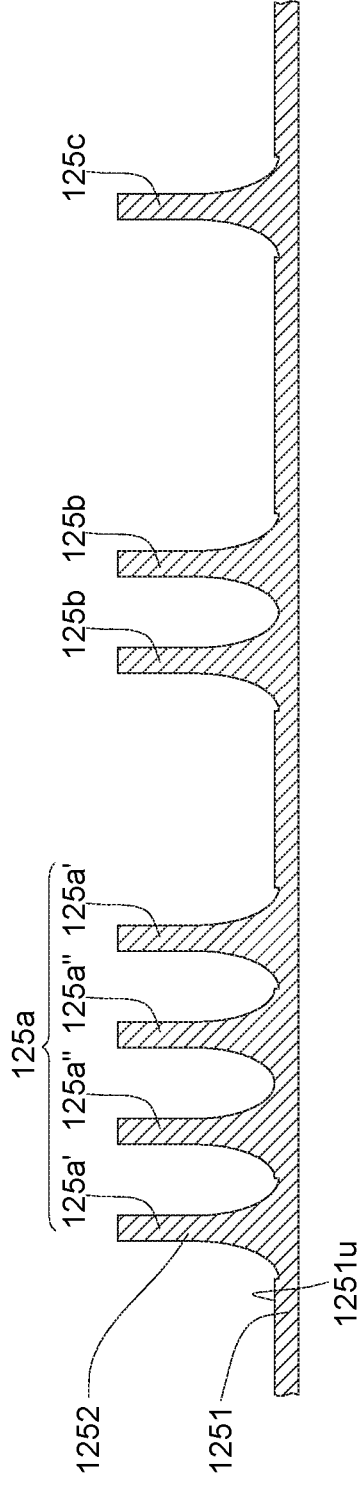
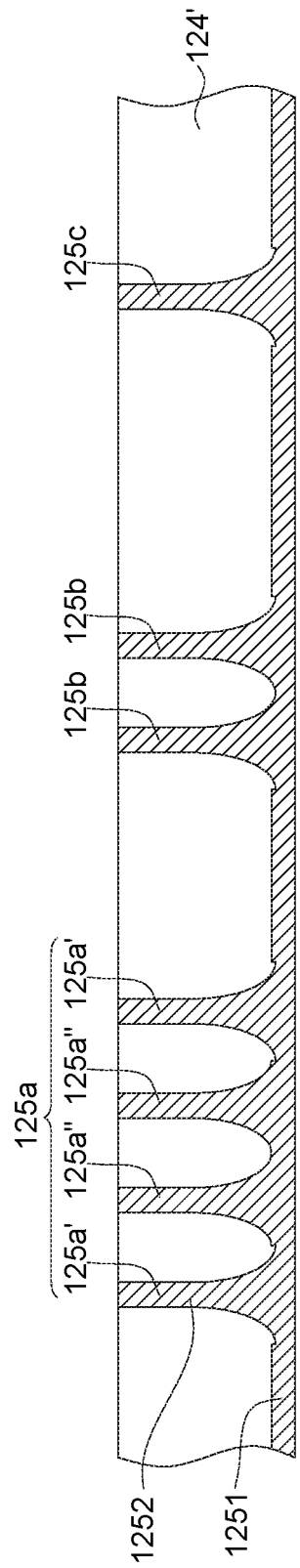

MANUFACTURING METHOD OF SEMICONDUCTOR CHIP

This application is a divisional application of co-pending application Ser. No. 16/121,730, filed Sep. 5, 2018, which claims the benefit of U.S. provisional application Ser. No. 62/574,772, filed on Oct. 20, 2017, the contents of which are incorporated herein by reference.

FIELD OF THE INVENTION

The invention relates to a manufacturing method of a semiconductor chip, and more particularly to a manufacturing method of a semiconductor chip including a transistor and a manufacturing method thereof.

BACKGROUND OF THE INVENTION

In general, one transistor includes a number of fins, wherein the outermost fin has a wide width. The same condition may be seen in the one transistor including only one fin. However, the fin having the wide width results in short-channel effects and low sensitivity of controlling switch and performance.

SUMMARY OF THE INVENTION

In an embodiment of the invention, a manufacturing method of a semiconductor chip. The manufacturing method includes the following steps. A substrate is provided. forming a first patterned block layer on the substrate; a part of the substrate is removed, through the first patterned block layer, to form a fin, wherein the fin comprises a base portion and a protrusion connected with the base portion, the protrusion is projected with respect to an upper surface of the base portion; a second patterned block layer covering the upper surface of the base portion is formed, wherein the second patterned block layer has a hollow portion exposing the protrusion; the protrusion is thinned through the hollow portion, wherein the fin forming a recess, and the recess is recessed with respect to the upper surface of the base portion; the second patterned block layer is removed; an insulation layer covering the base portion and the protrusion is formed, wherein the protrusion is projected with respect to the insulation layer.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIGS. 4A to 4G illustrate manufacturing processes of the semiconductor chip of FIG. 1B;

DETAILED DESCRIPTION OF PREFERRED EMBODIMENTS

Figure 1A:
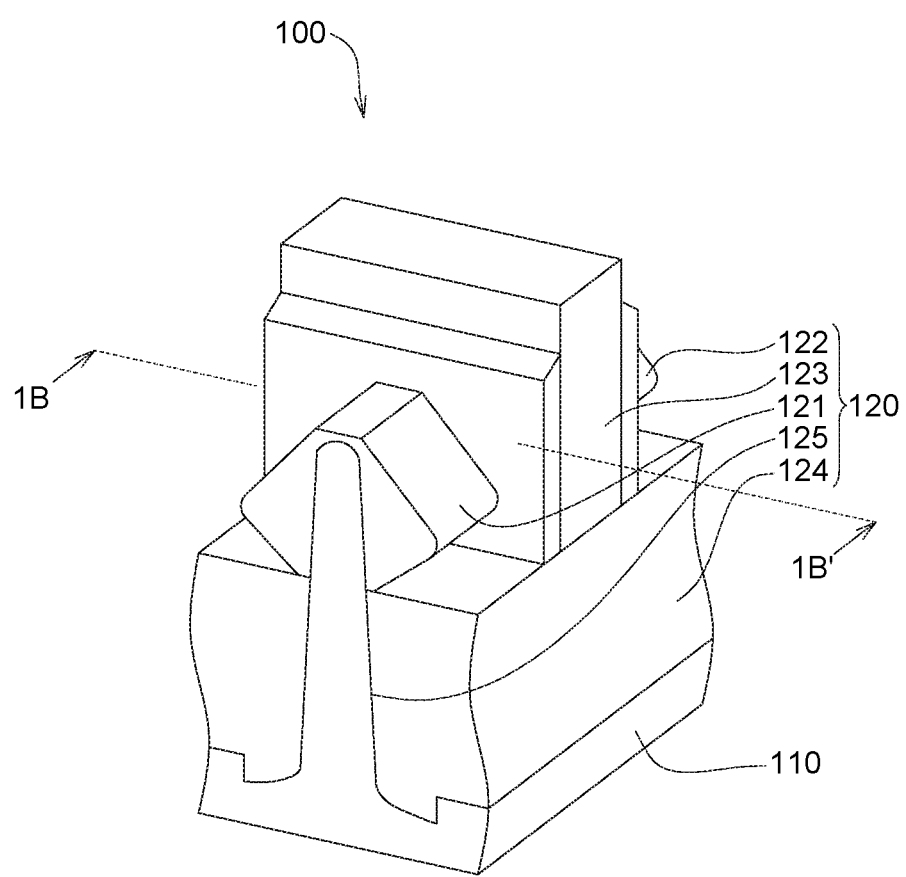
FIG. 1A illustrates a diagram of a semiconductor chip according to an embodiment of the invention.
Figure 1B:
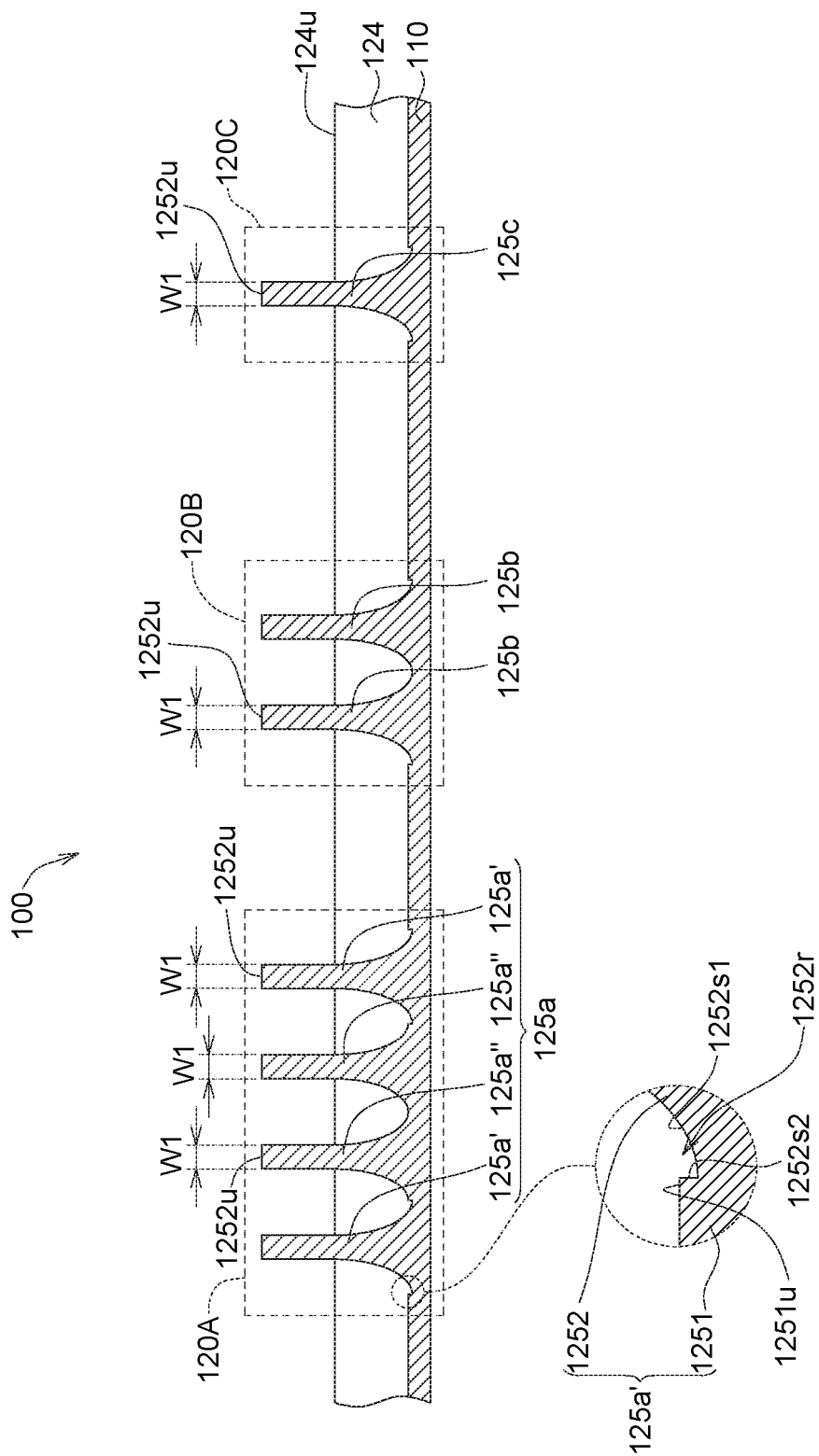
FIG. 1B illustrates a cross-sectional view (not illustrates the first doped portion) of the semiconductor chip of FIG. 1A along a direction 1B-1B'.

Referring to FIGS. 1A and 1B, FIG. 1A illustrates a diagram of a semiconductor chip 100 (illustrates one of plural fins) according to an embodiment of the invention, and FIG. 1B illustrates a cross-sectional view (not illustrates the first doped portion 121 and the second doped portion 122) of the semiconductor chip 100 of FIG. 1A along a direction 1B-1B'.

The semiconductor chip 100 includes a substrate 110 and at least one transistor 120. The substrate 110 is, for example, silicon substrate made of silicon wafer. The transistor 120 is formed on the substrate 110. The transistor 120 is, for example, FinFET (Fin Field Effect Transistor), etc. Each transistor 120 includes a first doped portion 121, a second doped portion 122 and a gate 123, an insulation layer 124 and at least one fin 125 (for example, the fins 125a, 125b and 125c in FIG. 1B). In an embodiment, the fin 125 may be a part of the substrate 110, that is, the fin 125 may be formed from the substrate 110.

As illustrated in FIG. 1A, in one transistor 120, the gate 123 connects the fin 125, and the first doped portion 121 and the second doped portion 122 are formed at two opposite lateral sides of the gate 123.

In an embodiment, the first doped portion 121 and the second doped portion 122 may be heavily doped regions, such as N-type heavily doped regions. Furthermore, the first doped portion 121 and the second doped portion 122 may be salicides. For example, the first doped portion 121 and the second doped portion 122 may be formed by way of silicide process. In an embodiment, one of the first doped portion 121 and the second doped portion 122 may be a source, and another of the first doped portion 121 and the second doped portion 122 may be a drain. The insulation layer 124 is shallow trench isolations (STI) made of $SiO_x$ or $SiN_x$, for example.

As illustrated in FIG. 1B, in the present embodiment, a number of the transistors 120 include at least one first transistor 120A, at least one second transistor 120B and at least one third transistor 120C. The first transistor 120A is a multi-fin transistor. For example, the first transistor 120A includes a number of fins 125a, wherein the gate 123 (not illustrated in FIG. 1B) connects all the fins 125a. In another embodiment, the number of the fins 125a may be four or larger than 4. The second transistor 120B includes two fins 125b, wherein the gate 123 (not illustrated in FIG. 1B) connect all the fins 125b. The third transistor 120C includes one fin 125c. In another embodiment, the semiconductor chip 100 may omit two of the first transistor 120A, the second transistor 120B and the third transistor 120C.

As illustrated in FIG. 1B, each fin 125a includes a base portion 1251 and a protrusion 1252 connected with the base portion 1251. Each protrusion 1252 is projected with respect to an upper surface 1251u of the base portion 1251. Each of at least one of the fins 125a has a recess 1252r recessed with respect to the upper surface 1251u. For example, the fins 125a includes a number of edge fins 125a' and at least one inner fin 125a" located between the edge fins 125a', wherein each edge fin 125a' has the recess 1252r recessed with respect to the upper surface 1251$u$. In the present embodiment, the base portion 1251 and the protrusion 1252 are a part of the substrate 110. The fin 125$b$ and/or the fin 125$c$ have the features similar to or the same as the fin 125$a$, and the similarities are repeated here.

As illustrated in FIG. 1B, in the present embodiment, the recess 1252$r$ has a curved bottom surface 1252$s$1 and a lateral surface 1252$s$2 connecting the curved bottom surface 1252$s$1 and the upper surface 1251$u$, The lateral surface 1252$s$2 is substantially perpendicular to the upper surface 1251$u$. In the present embodiment, the lateral surface 1252$s$2 is flat surface.

As illustrated in FIG. 1B, in the embodiment; in one transistor, the protrusion 1252 of each fin 125 has an upper surface 1252$u$, wherein the width W1 of the upper surface 1252$u$ of each protrusion 1252 is substantially equal. In any two transistors; the width W1 of the upper surface 1252$u$ of each protrusion 1252 of one transistor is as thin as the width W1 of the upper surface 1252$u$ of each protrusion 1252 of another transistor. For example, the width W1 of the upper surface 1252$u$ of the protrusion 1252 of the third transistor 1200 is as thin as the width W1 of the upper surface 1252$u$ of the protrusion 1252 of the first transistor 120A, and thus the transistor 1200 having only one fin also can improve short-channel effect; increase sensitivity of controlling switch and performance. In an embodiment, the width W1 may range between about 3 nm to about 15 nm, or about 5 nm to about 10 nm.

As illustrated in FIG. 1B, the first transistor 120A includes the edge fins 125$a$' and the inner fins 125$a$" located between the edge fins 125$a$', The width W1 of the upper surface 1252$u$ of the protrusion 1252 of the edge fin 125$a$' is substantially equal to the width W1 of the upper surface 1252$u$ of the protrusion 1252 of the inner fin 125$a$", In addition, the second transistor 120B include a number of edge fin 125$b$, and the width W1 of the upper surface 1252$u$ of the protrusion 1252 of the edge fin 125$b$ is substantially equal to the width W1 of the upper surface 1252$u$ of the protrusion 1252 of the inner fin 125$a$" of the first transistor 120A. In addition, the third transistor 1200 include one edge fin 125$c$, and the width W1 of the upper surface 1252$u$ of the protrusion 1252 of the edge fin 125$c$ is substantially equal to the width W1 of the upper surface 1252$u$ of the protrusion 1252 of the inner fin 125$a$" of the first transistor 120A.

Here, "edge fin" refers to the outermost fin in one transistor, for example, the edge fins 125$a$' in the first transistor 120A, the edge fins 125$b$ in the second transistor 120B, and the edge fin 125$c$ in the third transistor 1200. "Inner fin" refers to the fin which is located between the edge fins, for example, the inner fins 125$a$" which are located between the edge fins 125$a$' in the first transistor 120A.

Figure 2:
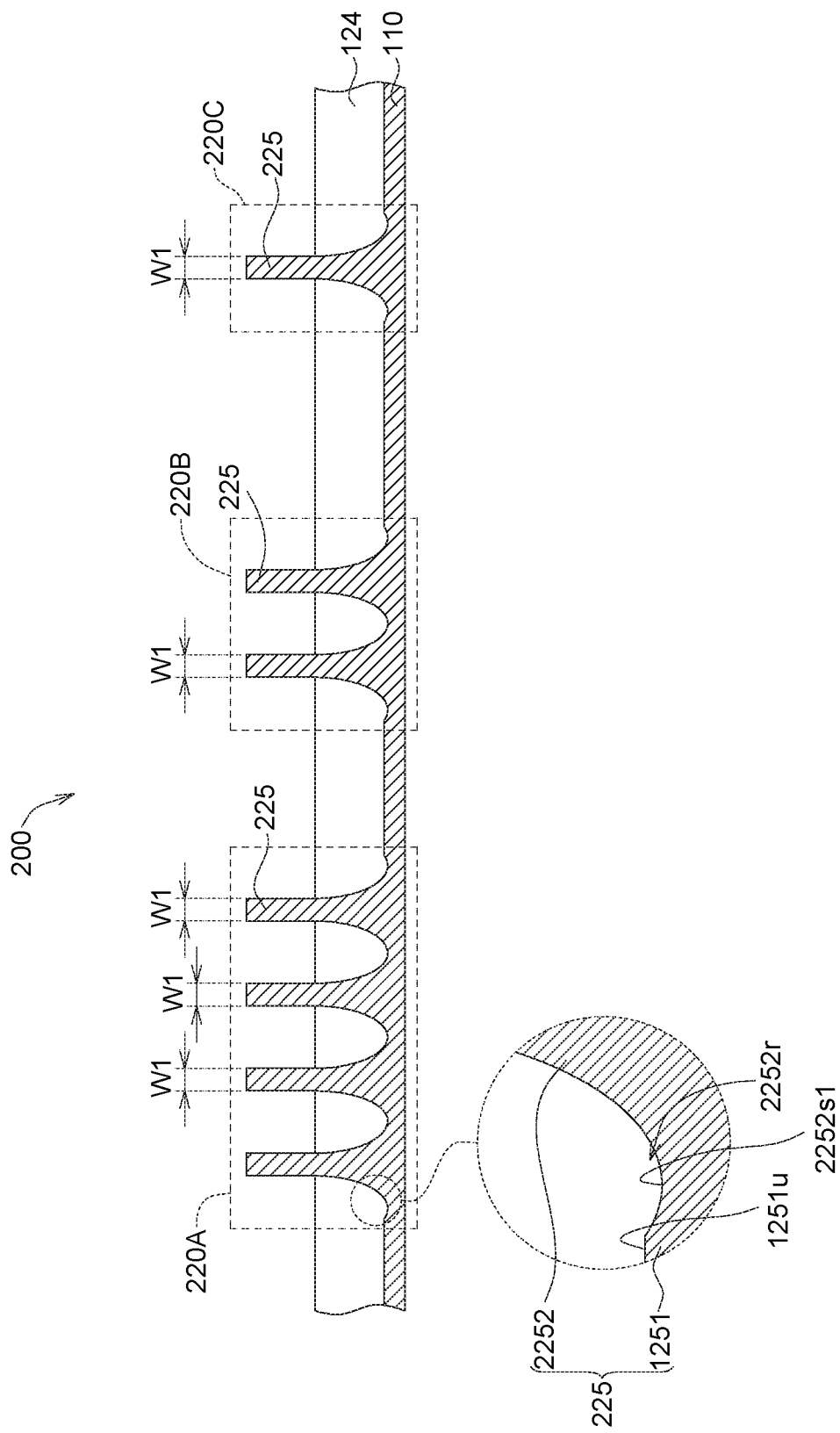
FIG. 2 illustrates a diagram of a semiconductor chip according to another embodiment of the invention.

FIG. 2 illustrates a diagram of a semiconductor chip 200 according to another embodiment of the invention. The semiconductor chip 200 includes the substrate 110 and at least one transistor 220. The transistor 220 is formed on the substrate 110. Each transistor 220 includes the first doped region 121 (not illustrated), the second doped region 122 (not illustrated) and the gate 123 (not illustrated), the insulation layer 124 and at least one fin 225. The transistor 220 is, for example, FinFET, etc. A number of transistors 220 includes at least one first transistor 220A having the features similar to the transistor 120A, at least one second transistor 220B having the features similar to the transistor 120B and at least one third transistor 2200 having the features similar to the transistor 1200.

In any transistor, each fin 225 includes the base portion 1251 and a protrusion 2252 connected with the base portion 1251. The protrusion 2252 is projected with respect to the upper surface 1251$u$ of the base portion 1251 and has a recess 2252$r$ recessed with respect to the upper surface 1251$u$. The recess 2252$r$ has the curved bottom surface 2252$s$1 directly extending to the upper surface 1251$u$.

Figure 3:
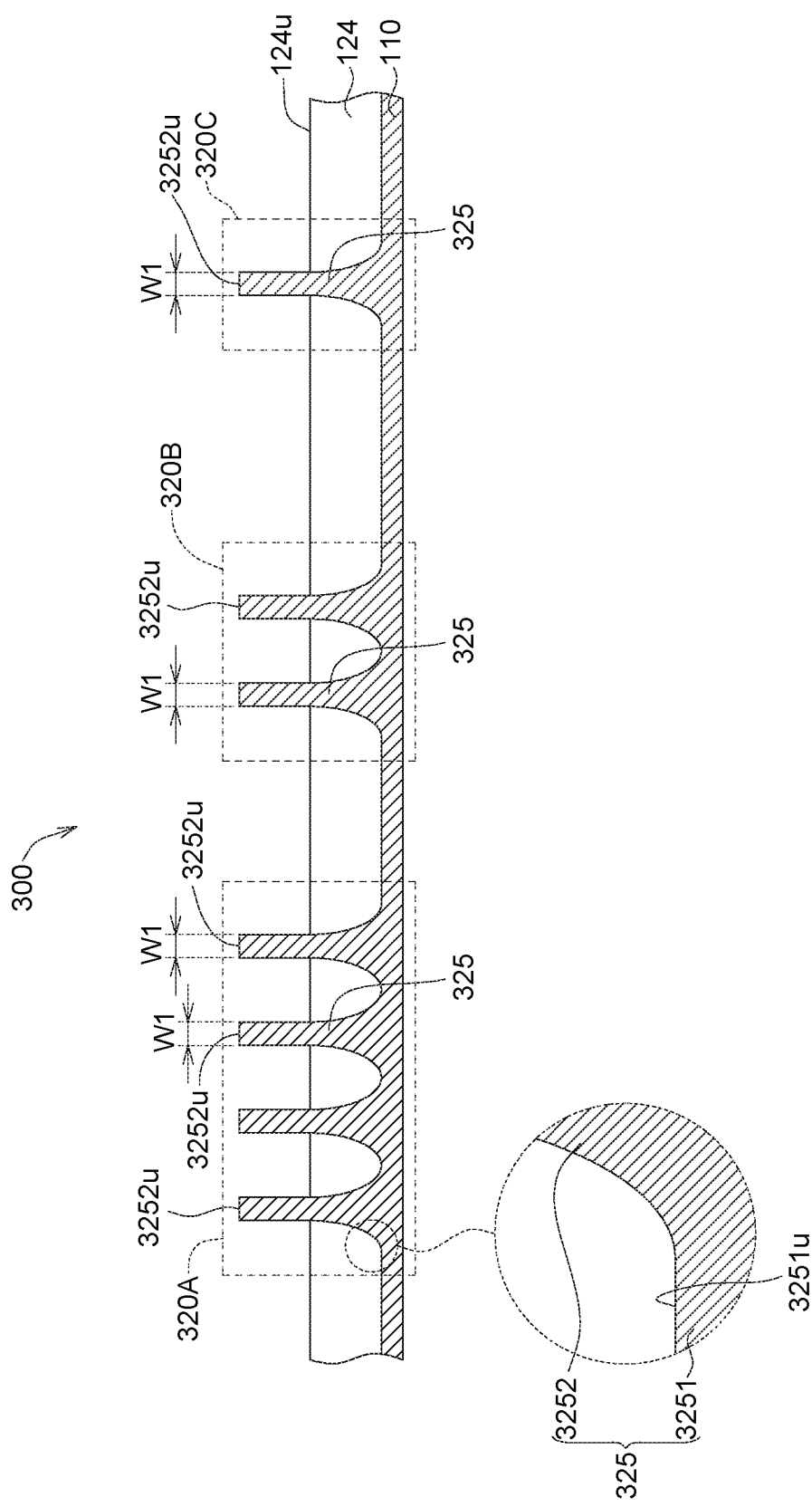
FIG. 3 illustrates a diagram of a semiconductor chip according to another embodiment of the invention.

FIG. 3 illustrates a diagram of a semiconductor chip 300 according to another embodiment of the invention. The semiconductor chip 300 includes the substrate 110 and at least one transistor 320. The transistor 320 is formed on the substrate 110. Each transistor 320 includes the first doped region 121 (not illustrated), the second doped region 122 (not illustrated) and the gate 123 (not illustrated), the insulation layer 124 and a plurality of fins 325. The transistor 320 is, for example, a FinFET, etc. A number of transistors 320 includes at least one first transistor 320A having the features similar to the transistor 120A, at least one second transistor 320B having the features similar to the transistor 120E and at least one third transistor 3200 having the features similar to the transistor 1200.

In any transistor, each fin 325 includes a base portion 1251 and a protrusion 3252 connected with the corresponding base portion 1251, wherein the protrusions 3252 are projected with respect to an upper surface 1251$u$ of the base portions 1251 and the insulation layer 124. Each protrusion 3252 has an upper surface 3252$u$, and the width W1 of each upper surface 3252$u$ is substantially equal.

FIGS. 4A to 4G illustrate manufacturing processes of the semiconductor chip 100 of FIG. 1B.

Figure 4A:
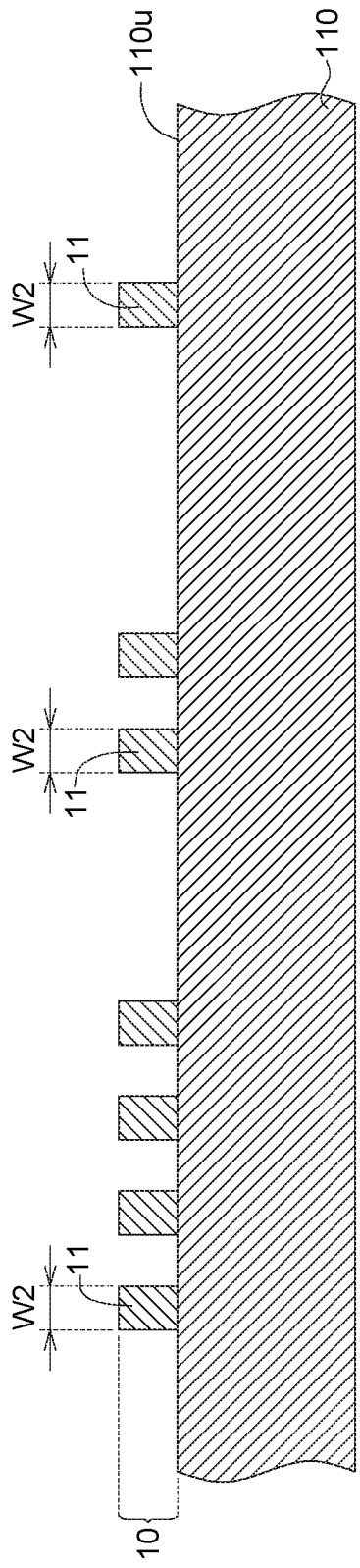

As illustrated in FIG. 4A, the substrate 110 is provided.

Then, as illustrated in FIG. 4A, a first patterned block layer 10 is formed on an upper surface 110$u$ of the substrate 110 by way of, for example, lithography, printing, etc. The first patterned block layer 10 includes a plurality of fin defining portions 11 for defining regions of the fins 125$a$, 125$b$ and 125$c$ in FIG. 4B. In the present embodiment, each fin defining portions 11 of the first patterned block layer 10 has the same width W2. In an embodiment, the first patterned block layer 10 is, for example, hard mask.

Figure 4B:
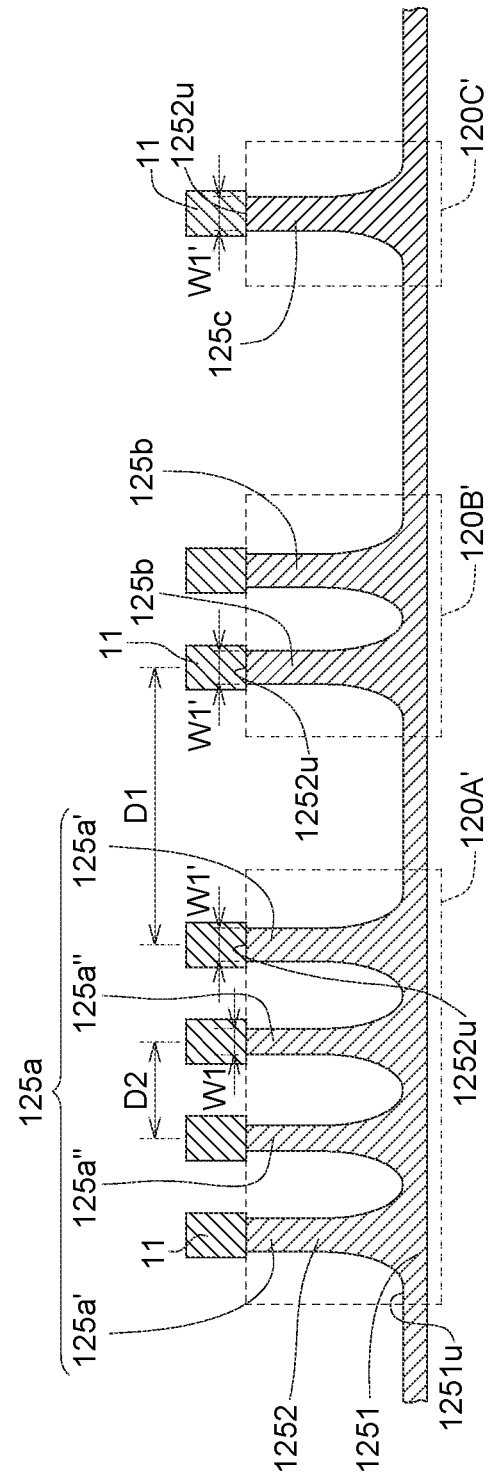
Figure 4C:
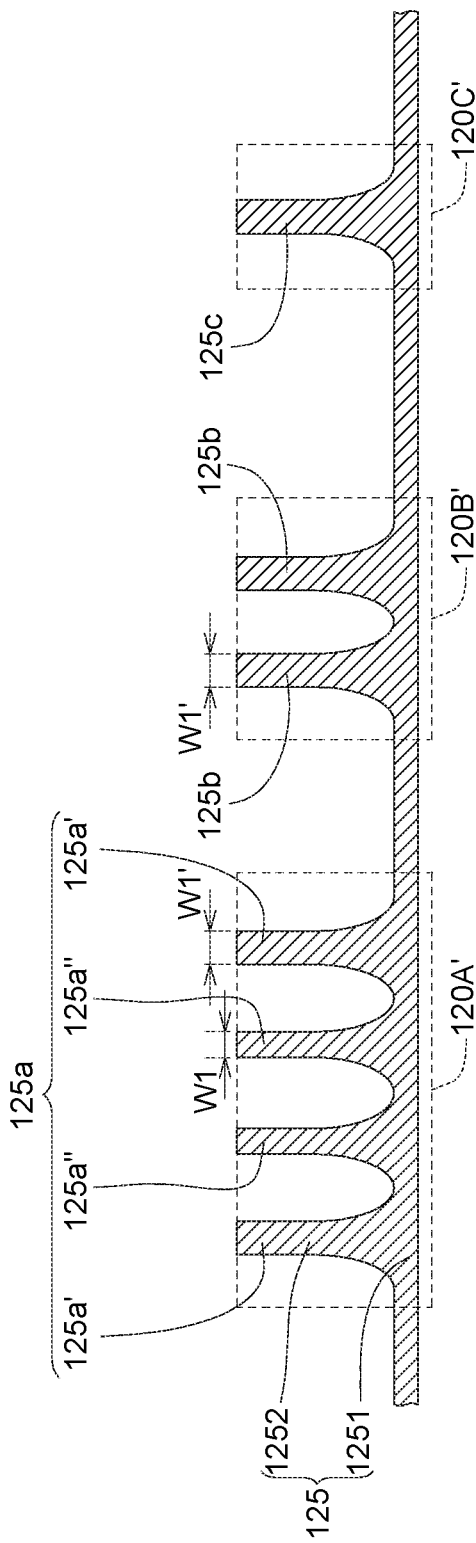

As illustrated in FIG. 4B, a part of the substrate 110 is removed by way of, for example, etching (for example, dry etching or wet etching), through the fin defining portions 11 of the first patterned block layer 10, to form the fins 125$a$, 125$b$ and 125$c$, wherein each fin includes a base portion 1251 and a protrusion 1252 connected with the base portion 1251, the protrusion 1252 has the upper surface 1252$u$ and is projected with respect to the upper surface 1251$u$ of the base portion 1251.

In FIG. 4B, a first transistor region 120A', a second transistor region 120B' and a third transistor region 1200' are defined. The first transistor region 120A' includes four fins 125$a$, the second transistor region 120B' includes two fins 125$b$, and the third transistor region 1200' includes one fin 125$c$.

In FIG. 4B, one transistor region is separated from neighbor component (for example, another transistor) by a distance, and thus its edge fin has a wide width. For example, a width W1' of the upper surface 1252$u$ of the edge fin 125$a$' of the first transistor region 120A', a width W1' of the upper surface 1252$u$ of the edge fin 125$b$ of the second transistor region 120B' and a width W1' of the upper surface 1252$u$ of the edge fin 125$c$ of the third transistor region 1200' are wide.

In FIG. 4B, two transistors are separated from each other by a distance, and thus the widths of the upper surfaces of the edge fins of the transistors are wide. For example, the first transistor region 120A includes a number of the edge fins 125$a$' and at least one inner fin 125$a$" located between the edge fins 125a', and the second transistor region 120B' includes a number of the edge fins 125b. The edge fins 125a' of the first transistor region 120A' is separated from the edge fins 125b of the second transistor region 120B' by a larger distance D1. One inner fin 125a" is separated from another inner fin 125a" of the first transistor region 120A' by a smaller distance D2. As a result, in the same etching time interval and etching rate, the removed amount of material in the smaller distance D2 results in the width W1 of the inner fin 125a" being thinner than the width W1' of the edge fin 125a'. On the contrary, in the same etching time interval and etching rate, the removed amount of material in the larger distance D1 results in the width W1' of the edge fin 125a' being wider than the width W1 of the inner fin 125a". In addition, the same principle may be applied to the second transistor region 120B' and the third transistor region 120␣0'.

In compared with the fin having wider wide (or thicker thickness), the fin having a smaller width (or thinner thickness) can improve short-channel effects, and accordingly increase sensitivity of controlling switch and performance.

Then, as illustrated in FIG. 4␣0, the first patterned block layer 10 is removed to expose the upper surface 1252u of each protrusion 1252.

Figure 4D:
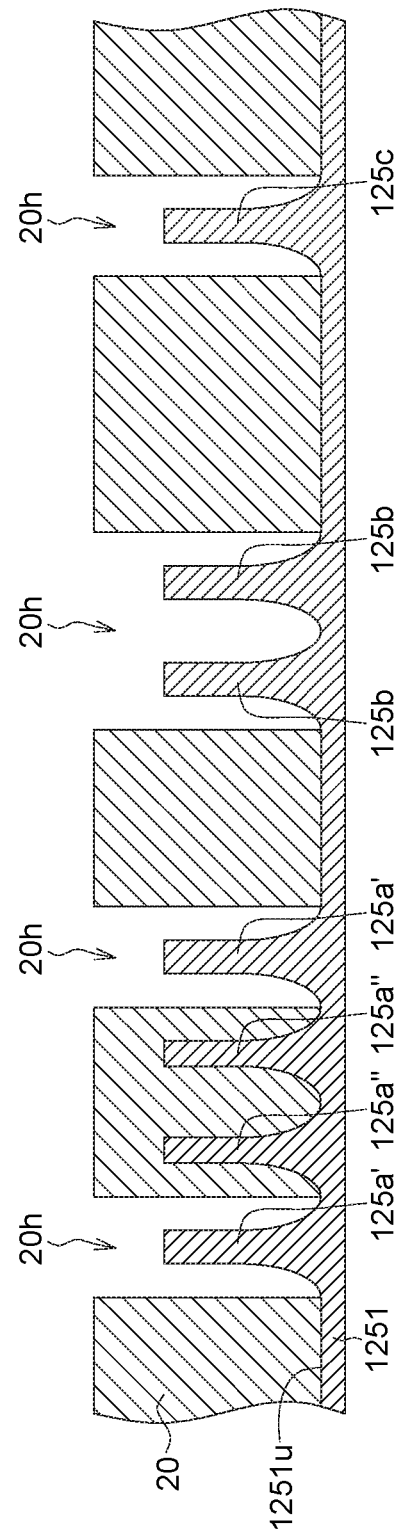

Then, as illustrated in FIG. 4D, a second patterned block layer 20 covering the upper surface 1251u of the base portion 1251 and the inner fins 125a" is formed by way of, for example, lithography, printing, etc., wherein the second patterned block layer 20 has at least one hollow portion 20h, and each protrusion 1252 of the edge fins 125a', 125b and 125c are exposed from the corresponding hollow portion 20h for thinning. In an embodiment, the second patterned block layer 20 is, for example, hard mask.

Figure 4E:
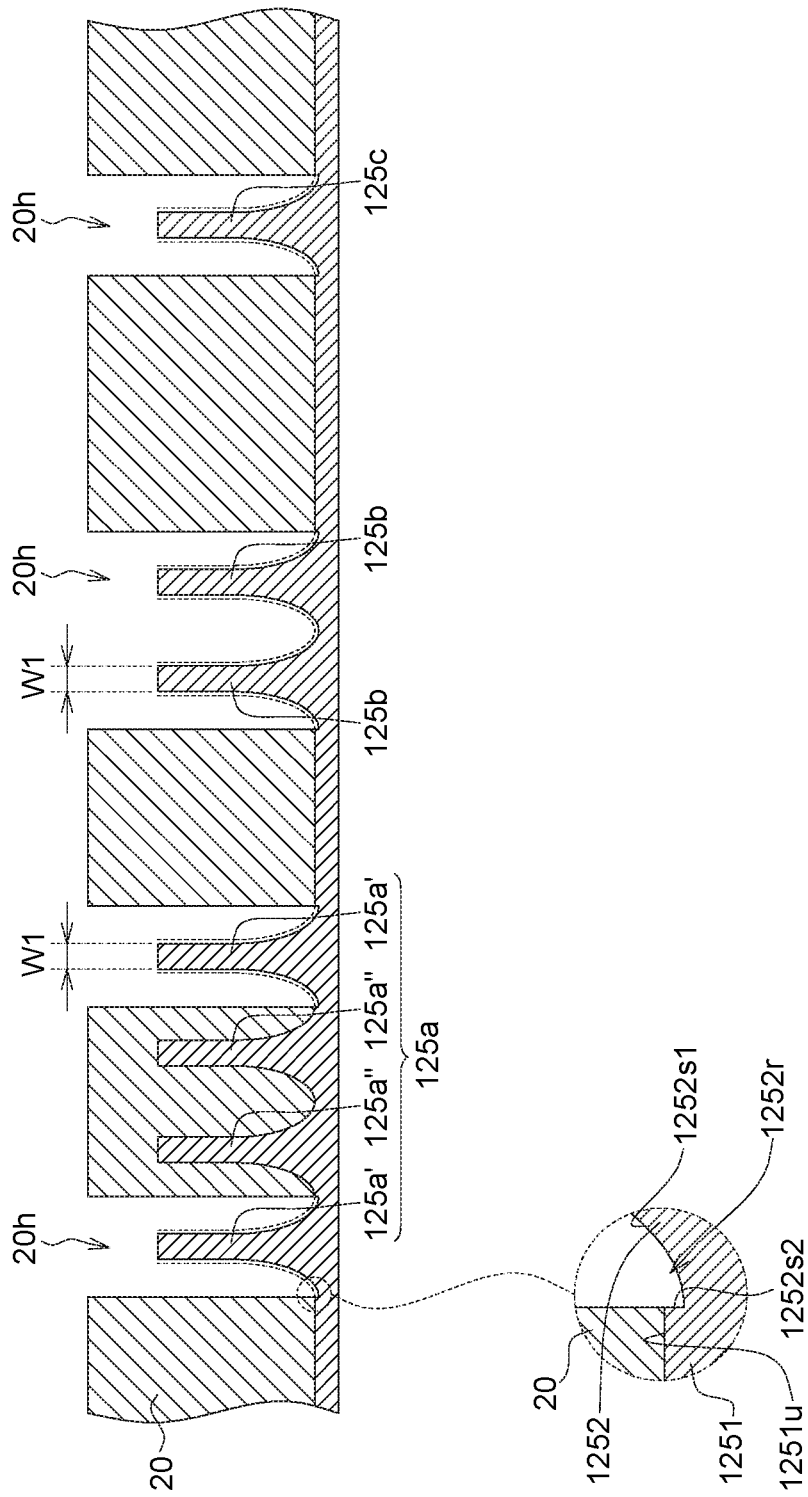

Then, as illustrated in FIG. 4E, the edge fin 125a', 125b and 125c are thinned through the hollow portions 1251h by way of, for example, etching. After thinning, the width W1' of the upper surface 1252u of the edge fin 125a', the width W1' of the upper surface 1252u of the protrusion 1252 of the edge fin 125b and the width W1' of the upper surface 1252u of the protrusion 1252 of the edge fin 125c are thinned to become width W1. In addition, after thinning, a recess 1252r is formed in each protrusion 1252 of the edge fin 125a', 125b, and each recess 1252r is recessed with respect to the upper surface 1251u of the base portion 1251. Due to the inner fin 125a" being covered by the second patterned block layer 20, the recess 1252r is not formed in each of the inner fins 125a".

Then, as illustrated in FIG. 4F, the second patterned block layer 20 is removed by way of etching to expose the upper surface 1251u of the base portion 1251 and the inner fins 125a" (if any).

Then, as illustrated in FIG. 4G, an insulation layer material 124' covering the base portion 1251 and the protrusion 1252 of each fin 125a, 125b and 125c, wherein the insulation layer material 124' expose the upper surfaces 1252u of the protrusions 1252 after polishing.

Then, a part of the insulation layer material 124' is removed to form the insulation layer 124, wherein the protrusion 1252 of each fin is projected with respect to an upper surface 124u (illustrated in FIG. 1B) of the insulation layer 124 Then, the first doped portion 121 (illustrated in FIG. 1A), the second doped portion 122 (illustrated in FIG. 1A) and the gate 123 (illustrated in FIG. 1A) are formed on each transistor to form at least one first transistor 120A, at least one second transistor 120B and/or at least one third transistor 120␣0.

Figure 5:
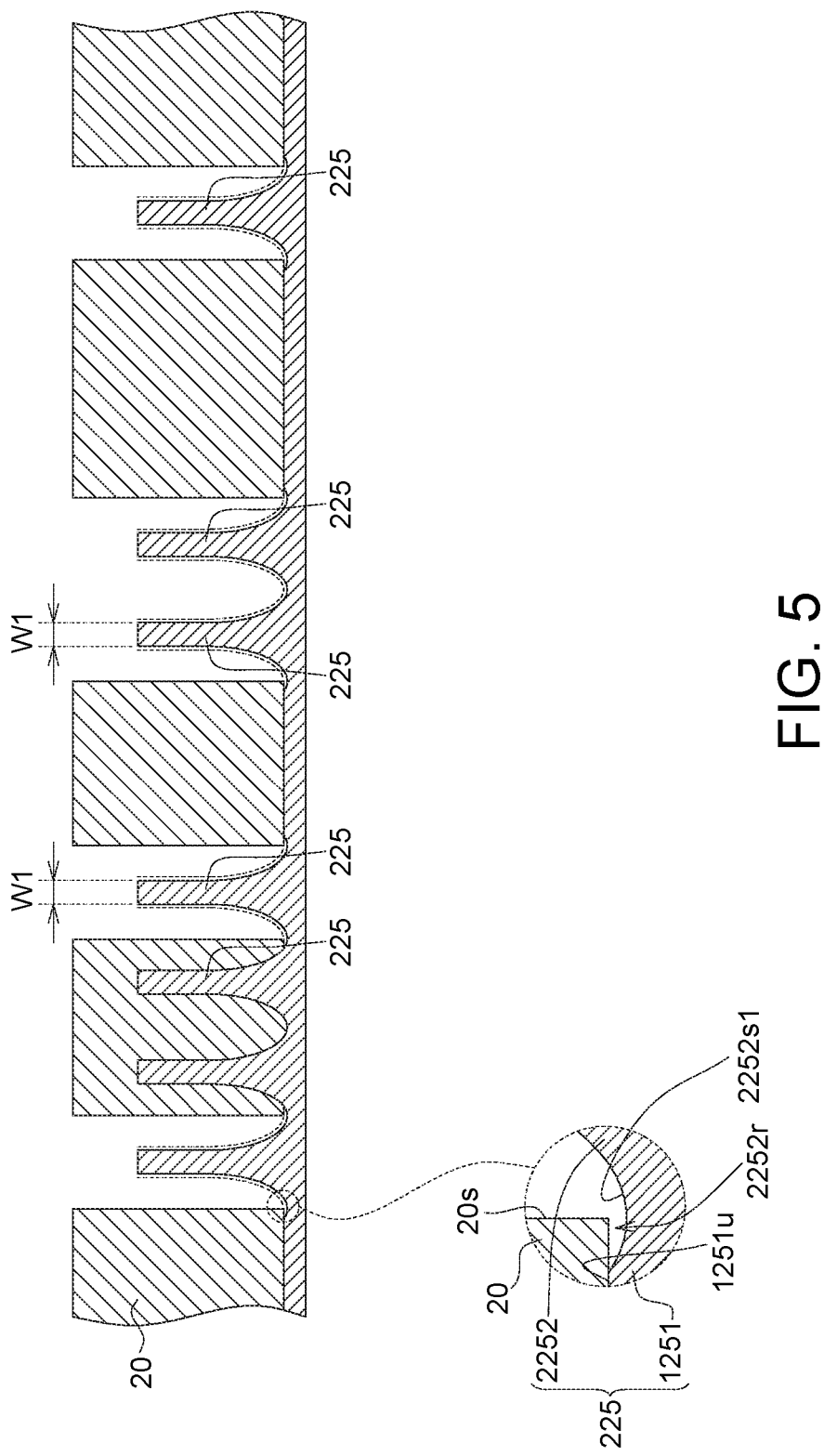
FIG. 5 illustrates manufacturing process of the semiconductor chip of FIG. 2.

FIG. 5 illustrates manufacturing process of the semiconductor chip 200 of FIG. 2. Under controlling etching condition, the recess 2252r extends to be recessed with respect to a lateral surface 20s of the second patterned block layer 20. The recess 2252r has the curved bottom surface 2252s1 directly extending to the upper surface 1251u, The other manufacturing processes of the semiconductor chip 200 may be similar to or the same as the corresponding manufactured processes of the semiconductor chip 100.

FIGS. 6A to 6G illustrate manufacturing processes of the semiconductor chip 300 of FIG. 3.

Figure 6A:
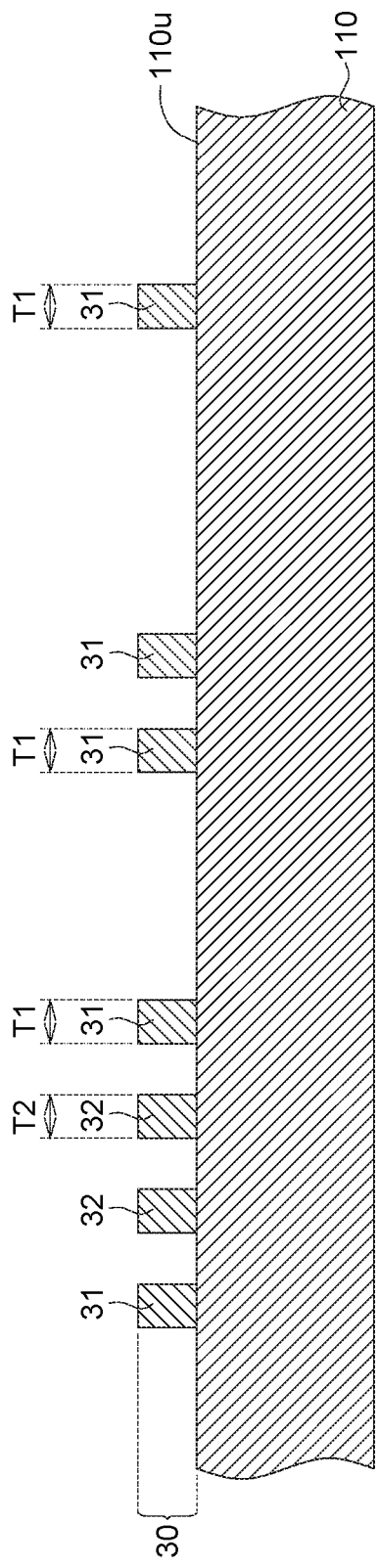
FIGS. 6A to 6G illustrate manufacturing processes of the semiconductor chip of FIG. 3.

As illustrated in FIG. 6A, the substrate 110 is provided.

Then, as illustrated in FIG. 6A, a first patterned block layer 30 is formed on the upper surface 110u of the substrate 110 by way of, for example, lithography, printing, etc. The first patterned block layer 30 includes a plurality of edge blocks 31 and at least inner block 32 located between the edge blocks 31. In this process, each edge block 31 has a width T1, and each inner block 32 has a width T2, wherein the width T1 and the width T2 are substantially equal. In an embodiment, the first patterned block layer 30 is, for example, hard mask.

Figure 6B:
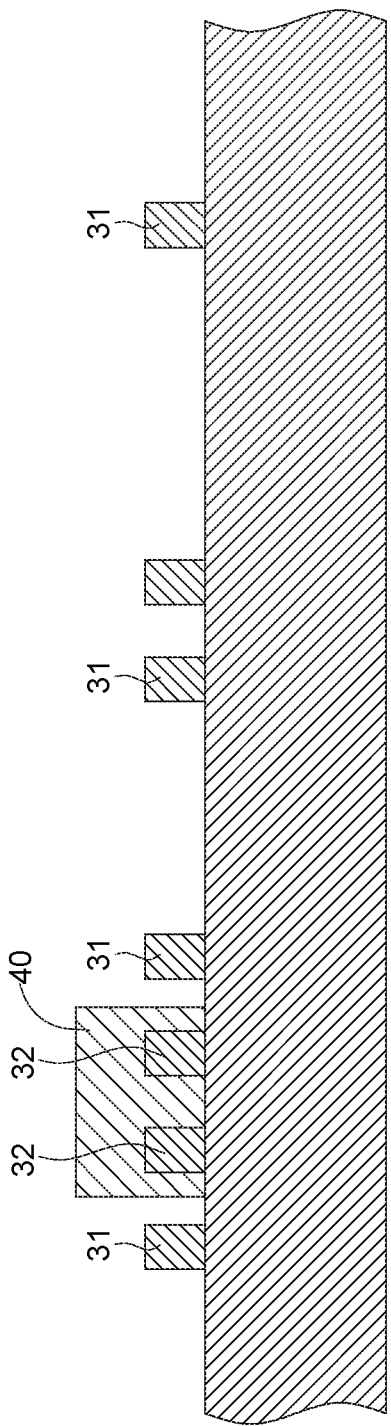

Then, as illustrated in FIG. 6B, a second patterned block layer 40 covering the inner blocks 32 is formed by way of, for example, lithography, printing, etc. In an embodiment, the second patterned block layer 40 is, for example, hard mask.

Figure 6C:
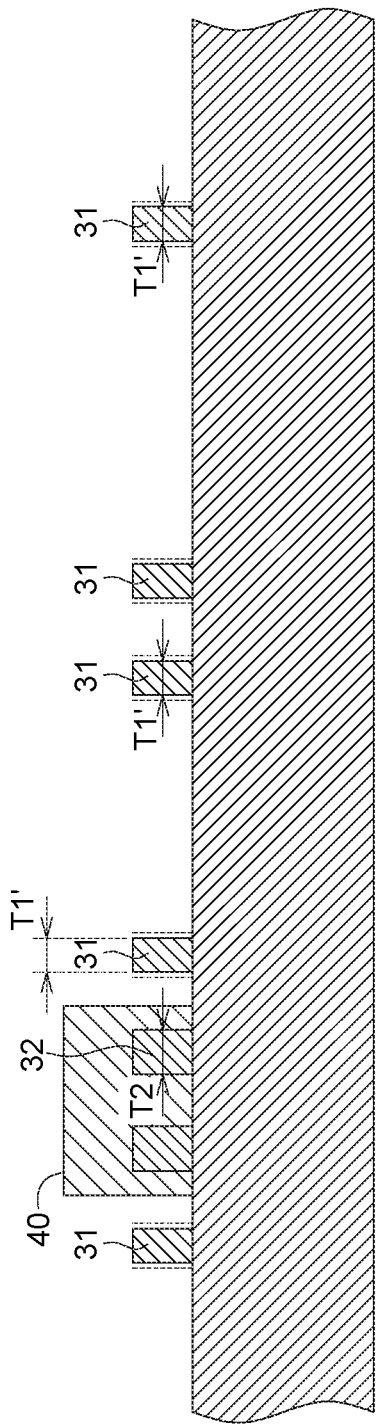

Then, as illustrated in FIG. 6C, each edge block 31 is thinned by way of, for example, etching, etc. After thinning, the width T1 of each edge block 31 is thinned to become the width T1'. Due to the inner block 32 being covered, each inner block 32 maintains initial width T2.

Figure 6D:
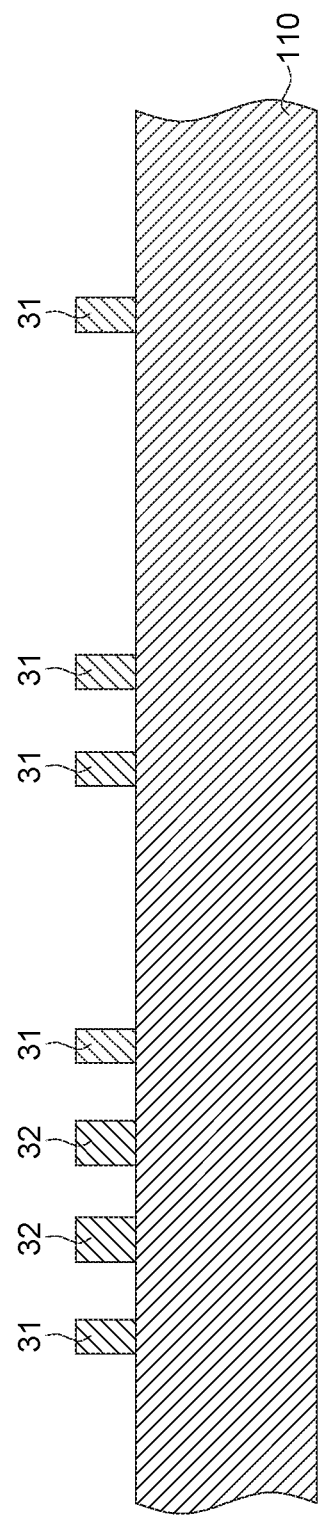

Then, as illustrated in FIG. 6D, the second patterned block layer 40 is removed by way of etching to expose the inner fins 32.

Figure 6E:
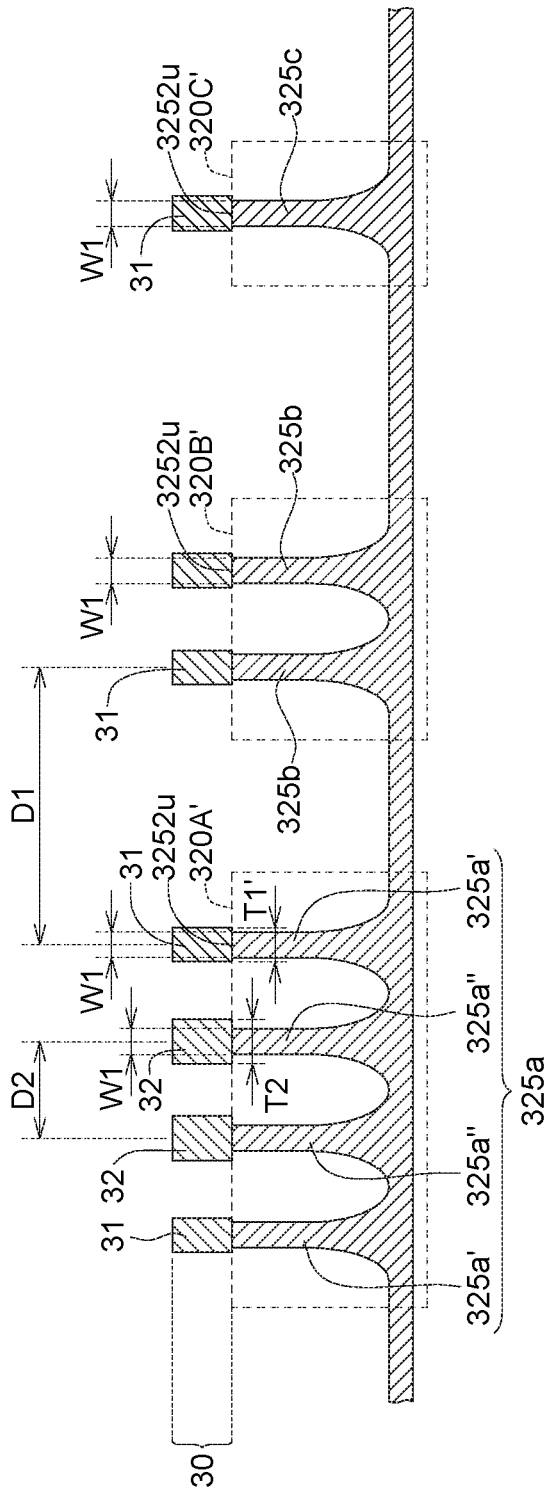

Then, as illustrated in FIG. 6E, a part of the substrate 110 is removed through the exposed inner blocks 32 and the edge blocks 31 of the first patterned block layer 30 to form a plurality of fins including a number of edge fins 325a', 325b and 325c and a number of the inner fins 325a", wherein each fin includes a base portion 1251 and a protrusion 3252 connected with the base portion 1251, and the protrusions 3252 are projected with respect to the base portions 1251.

In FIG. 6E, the first transistor region 320A', the second transistor region 120B' and the third transistor region 120C' are defined. The first transistor region 320A' includes four fins 325a, the second transistor region 320B' includes two fins 325b, and the third transistor region 320C' includes one fin 325c.

In FIG. 6E, each protrusion 3252 has the upper surface 3252u, Due to the width T1' of the edge block 31 being smaller than the width T2 of the inner block 32, the thinned edge block 31 can allow more etching source to reach the substrate 110 (illustrated in FIG. 6D) than the wider inner block 32, and accordingly the width W1 of the edge fin 325a' below the edge block 31 can be as thin as the width W1 of the inner fin 325a" below the inner block 32 even if the distance D1 is larger the distance D2.

Figure 6F:
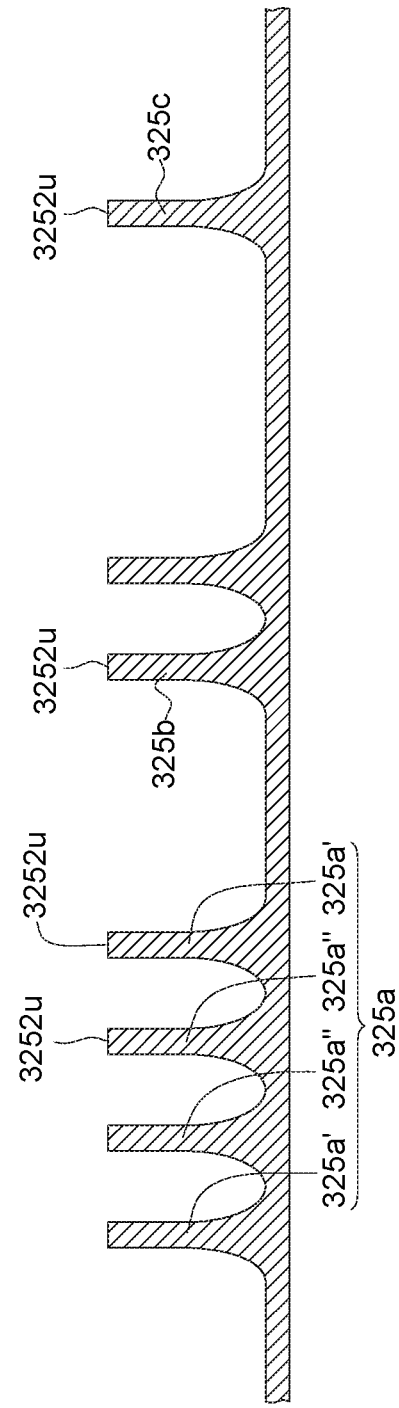

Then, as illustrated in FIG. 6F, the second patterned block layer 40 is removed by way of, for example, etching to expose the upper surface 1251u of the base portion 1251 and the inner fins 325a" (if any).

Figure 6G:
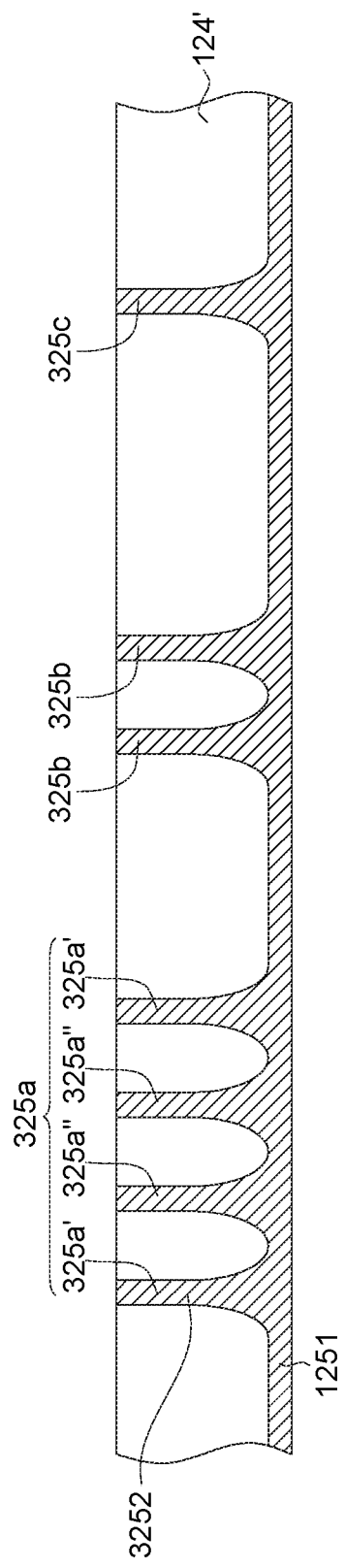

Then, as illustrated in FIG. 6G, an insulation layer material 124' covering the base portion 1251 and the protrusion 3252 of each fin 325a, 325b and 325c, wherein the insulation layer material 124' expose the upper surfaces 3252u of the protrusions 3252 after polishing.

Then, a part of the insulation layer material 124' is removed to form the insulation layer 124, wherein the protrusion 3252 of each fin is projected with respect to the upper surface 124u (illustrated in FIG. 3) of the insulation layer 124 Then, the first doped portion 121 (illustrated in FIG. 1A), the second doped portion 122 (illustrated in FIG. 1A) and the gate 123 (illustrated in FIG. 1A) are formed on each transistor to form at least one first transistor 320A, at least one second transistor 320B and/or at least one third transistor 3200 of FIG. 3.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a semiconductor chip, comprises:
    providing a substrate;
    forming a first patterned block layer on the substrate;
    removing a part of the substrate, through the first patterned block layer, to form a fin, wherein the fin comprises a base portion and a protrusion connected with the base portion, the protrusion is projected with respect to an upper surface of the base portion;
    forming a second patterned block layer covering the upper surface of the base portion, wherein the second patterned block layer has a hollow portion exposing the protrusion;
    thinning the protrusion through the hollow portion, wherein a recess is formed in the protrusion, and the recess is recessed with respect to the upper surface of the base portion;
    removing the second patterned block layer; and
    forming an insulation layer covering the base portion and the protrusion, wherein the protrusion is projected with respect to the insulation layer.

2. The manufacturing method according to claim 1, wherein in step of removing the part of the substrate, a plurality of the fins are formed, wherein the fins comprises a plurality of edge fins and an inner fin located between the edge fins;
    in step of forming the second patterned block layer covering the upper surface of the base portion, the second patterned block layer has a plurality of the hollow portions, the edge fins are exposed from the hollow portions;
    in step of thinning the fin through the hollow portion, the protrusions of the edge fins are thinned through the hollow portions.

3. The manufacturing method according to claim 1, wherein in step of forming the first patterned block layer on the substrate, the first patterned block layer comprises a plurality of fin defining portions, and a width of each fin defining portion is equal; and
    in step of removing the part of the substrate, a plurality of the fins are formed through the fin defining portions.

* * * * *